United States Patent [19]
Darrow et al.

[11] Patent Number: 5,205,750
[45] Date of Patent: Apr. 27, 1993

[54] TEMPERATURE COMPENSATING STRAIN RELIEF CONNECTION FOR FLEXIBLE ELECTRICAL CIRCUITS

[75] Inventors: Robert E. Darrow, Apalachin; David E. Engle, Vestal, both of N.Y.

[73] Assignee: International Business Machines, Armonk, N.Y.

[21] Appl. No.: 802,917

[22] Filed: Dec. 6, 1991

[51] Int. Cl.$^5$ ............................................. H01R 9/09
[52] U.S. Cl. ........................................ 439/77; 439/67; 439/91; 439/460; 439/493; 439/499
[58] Field of Search ................. 439/66, 67, 77, 91, 439/263, 452, 460–462, 493, 499, 591

[56] References Cited

U.S. PATENT DOCUMENTS

| | | |
|---|---|---|
| 4,054,348 | 10/1977 | Stroupe et al. . |
| 4,172,626 | 10/1979 | Olsson . |
| 4,192,571 | 3/1980 | Strautz . |
| 4,220,383 | 9/1980 | Scheingold et al. . |
| 4,542,949 | 9/1985 | Tewes et al. . |
| 4,571,015 | 2/1986 | Mueller . |
| 4,601,525 | 7/1986 | Kandybowski . |
| 4,695,258 | 9/1987 | Hanoon et al. ................. 439/67 |
| 4,824,379 | 4/1989 | Roberts et al. . |
| 4,871,315 | 10/1989 | Noschese . |
| 4,925,401 | 5/1990 | Fogg et al. . |
| 4,969,828 | 11/1990 | Bright et al. . |
| 5,102,343 | 4/1992 | Knight et al. ................. 439/67 |

FOREIGN PATENT DOCUMENTS
2101819A 1/1983 United Kingdom .

Primary Examiner—Paula A. Bradley
Attorney, Agent, or Firm—Calfee Halter & Griswold

[57] ABSTRACT

A structure and method for mounting a flexible electrical circuit to rigid substrate to effect electrical connection between contacts on one side of the flexible electrical circuit with electrical pads on one side of the substrate is provided. The connection allows for strain relief due to mechanical stress, as well as compensating for thermally induced stress. The structure includes a clamping member disposed to clamp and position the flexible circuit with its one side in face to face relationship with the surface of the substrate. A supporting structure is carried by the substrate and has a mounting member mounting the clamping member to maintain the flexible circuit and the substrate in face to face contacting relationship. The mounting structure also includes a spring mechanism yieldingly responsive to thermal expansion stress which mechanism urges the flexible circuit into contact with the substrate. The invention also includes an assembly tool for aiding in the formation of bonds between the pads and the contacts.

13 Claims, 8 Drawing Sheets

TEMPERATURE COMPENSATING STRAIN RELIEF CONNECTION FOR FLEXIBLE ELECTRICAL CIRCUITS

BACKGROUND OF THE INVENTION

This invention relates generally to connecting flexible cables to substrates, and more particularly to the connection of a flexible circuit to a rigid substrate which connection provides for strain relief of the connection due to mechanical stresses as well as providing for compensation for thermal expansion to thereby prevent impairment of the connection. In even more particular aspects, this invention is particularly suited for use in connecting flexible circuit to ceramic substrates which are used in cryogenic applications and which during their processing and utilization are subject to temperature excursions in excess of 250° C. and wherein conductive paste is utilized to form the interconnection between the substrate and the flexible circuit.

DESCRIPTION OF THE PRIOR ART

One of the requirements generally encountered when providing connections of flexible circuit to rigid substrates is that there should be provided some type of strain relief mechanism to prevent any mechanical stress applied to the flexible circuit either during assembly or in subsequent operation from being transmitted to the electrical contact points between the flexible circuit and the substrate. These mechanisms take many different forms but generally include some type of clamping mechanism which intercepts or isolates or relieves any stresses applied to the flexible circuit in a manner which will prevent such stresses from being applied at the electrical connections between the flexible circuit and the substrate and thus causing either a complete pulling off of the flexible circuit from the substrate or at least causing some type of impairment of certain or all of the connections. These are conventionally referred to as "strain relief" devices.

There have been many different prior art proposals for various types of devices which provide strain relief. These generally take the form of some type of clamping device applied to the flexible circuit or cable. For example, U.S. Pat. No. 4,172,626 discloses a removable connector system for connecting a flexible circuit to a printed circuit board which includes a clip that engages a flexible circuit to provide contact force between flexible circuit and a terminal post. It also mounts to a printed circuit board. The clip is the supporting member for a contact spring which is a non-critical locating member. A strain relief halter locks the flexible circuit to the clip to allow disassembly.

U.S. Pat. No. 4,871,315 relates to a removable connector system connecting a flexible circuit to a printed circuit board which includes a mounting piece that clamps the flexible circuit to a housing for strain relief. A spring loaded top piece and springs work in conjunction with another spring array to provide contact pressure. This assembly is then rigidly fastened to the board without the possibility of movement.

U.S. Pat. No. 4,925,401 provides two parts which together provide strain relief for a flexible circuit following a rotating type of assembly. These are used to apply contact force and are rigidly attached to the substrate. U.S. Pat. No. 4,054,348 discloses a mechanism for strain relief which relief is achieved by sliding flexible circuit into the slot and deforming the flexible circuit to retain the flexible circuit in the slot. This same part is then used to provide contact force and provide strain relief. This is a rigid attachment. U.S. Pat. No. 4,192,571 discloses a structure wherein strain relief is provided by a mechanism which is rigidly attached to the substrate. While these patents generally show connections of flexible circuits to a substrate which connections provide for strain relief due to mechanical stress, none of them provide any relief due to thermal expansion or contraction of the elements.

U.S. Pat. No. 4,571,015 and British Patent No. 2,101,819A disclose certain techniques for connection of ceramic substrates to printed circuit boards but do not teach or suggest the connection of flexible circuits to substrates for strain relief.

While the above references teach various types of the connections, none of them provide for compensation for temperature excursions at the location where a flexible circuit is electrically connected to the printed circuit board. This is especially critical in applications where the circuit board is to be used in cryogenic applications (which can be as low as 77° K.) and wherein conductive paste is used to form the electrical connections, and which connection technique requires heating during the manufacturing operation to form the connections. In such case, the temperature excursions can be as much as 250° C. or more.

SUMMARY OF THE INVENTION

According to the present invention, a structure and method for mounting a flexible electrical circuit to rigid substrate to effect electrical connection between contacts on one side of the flexible circuit with electrical pads on one side of the substrate is provided. The connection allows for strain relief due to mechanical stress, as well as compensating for thermally induced stress. The structure includes a clamping member disposed to clamp and position the flexible circuit with its one side in face to face relationship with the surface of the substrate. A supporting structure is carried by the substrate and has a mounting member mounting the clamping member to maintain the flexible circuit and the substrate in face to face contacting relationship. In more particular aspects, the mounting structure includes an element slidably and yieldingly mounted in the supporting structure which contacts the opposite side of the flexible circuit and normally urges the contacts on the flexible circuit into engagement with the pads on the substrate to provide compensation for thermally induced stresses. An assembly tool for aiding in forming bonds between the flexible circuit and substrate is also provided.

DESCRIPTION OF THE PREFERRED EMBODIMENT

Figure 1:
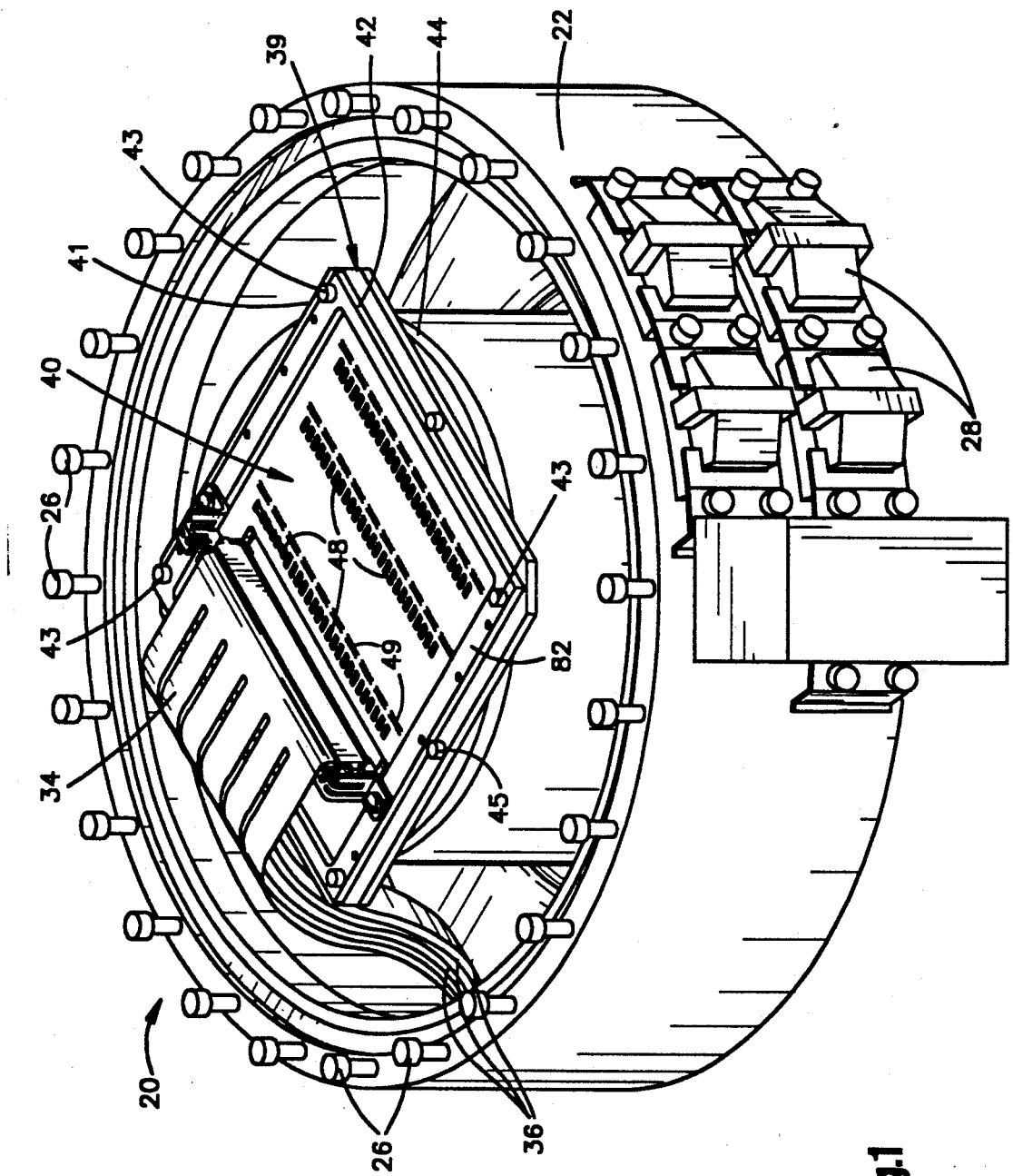
FIG. 1 is a perspective view somewhat diagrammatic showing the mounting of a flexible circuit onto a ceramic printed circuit board according to this invention as used in a cryogenic cooler.
Figure 2:
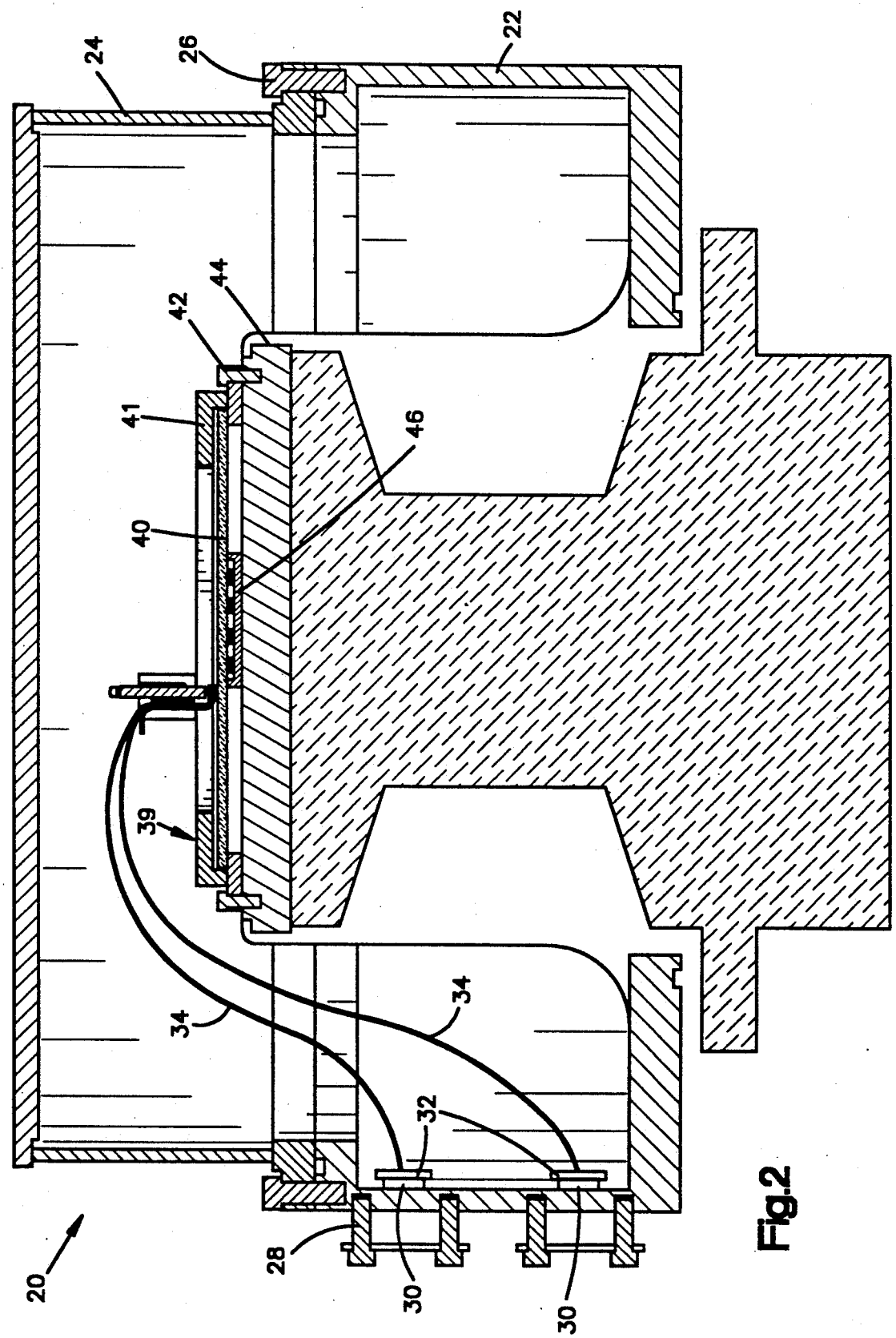
FIG. 2 is a longitudinal sectional view somewhat diagrammatic of the mounting of the flexible circuit to the rigid substrate in a cryogenic cooler.

Referring now the drawings and for the present to FIGS. 1 and 2, one embodiment of the present invention for connecting a flexible circuit to a rigid substrate is shown as it is utilized in a cryogenic environment. The substrate is mounted in a conventional cryogenic cooler and the flexible circuit is utilized to provide the electrical connections between the substrate and the environment outside of the cryogenic cooler, with the substrate acting as a mounting for semiconductor chips.

Figure 5:
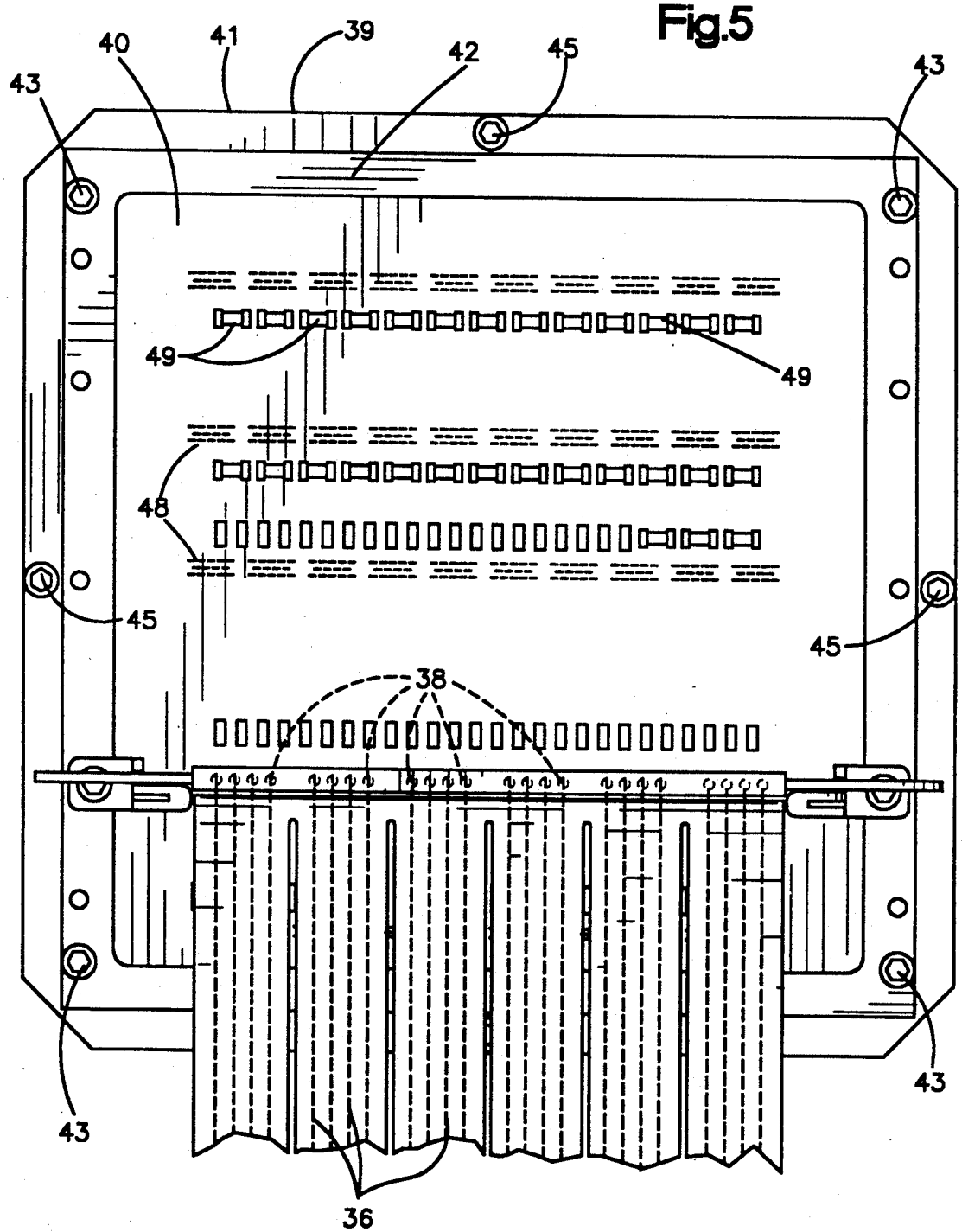
FIG. 5 is a plan view of the connection of flexible circuit to the substrate.

As can be seen in FIGS. 1 and 2, a cryogenic cooler unit 20 is provided which has a housing 22 and a cover 24. The cover 24 is secured to the housing 22 by means of bolts 26 spaced therearound. Conventional through wall connectors 28 are incorporated in the housing 22 which provide for the connection between the interior of the housing 22 and the exterior of the cryogenic unit 20. These through wall connectors 28 include conventional internal pins 30 which are configured to plug into female connectors 32 each of which is secured to one end of a flexible circuits 34. The flexible circuits 34 conventionally will have conductors 36 formed on at least one surface thereof with the conductors 36 terminating in contacts 38 which contacts are to be connected to a substrate in the form of a circuit board structure 39 (see also FIGS. 3 and 5). As described thus far, the flexible circuit and its mounting to a cryogenic cooler using a female connector at one end thereof is conventional.

The circuit board structure normally utilized in a cryogenic device typically is constructed of a ceramic circuit board 40 which is relatively brittle and has a relatively low coefficient of thermal expansion. The circuit board structure 39 conventionally is formed by a pair of frame members 41 and 42 between which the board 40 is secured by means of screws 43. The circuit board structure 39 is mounted on a mounting pedestal 44 formed internally of the housing 22 by means of mounting bolts 45. Typically a semiconductor chip 46 is mounted on the bottom side of the circuit board 40 and connected by vias (not shown) passing through the circuit board 40 to pads 48 on the top surface thereof. Circuit components such as capacitors 49 (see also FIG. 5) may be also be provided on the surface of the circuit board 40 which contains the pads 48. (Typically, there may be many more capacitors and other components but these are shown for illustrative purposes.)

It is to the pads 48 on the circuit board that the contacts 38 on the flexible circuit 34 are to be connected. This connection can be formed in several different ways but according to the preferred embodiment of the present invention, this connection is formed by conductive paste as will be described presently. To form this connection it is necessary that some type of strain relief mechanism or structure be provided so that the connections between the contacts 38 on the flexible circuit 34 and the pads 48 on the circuit board 40 will not be impaired due to any type of either mechanical shear force or mechanical tensile force being applied to the flexible circuit. To this end, a strain relief clamping structure 50 is provided which secures the flexible electrical circuit 34 to the circuit board 40.

Figure 3:
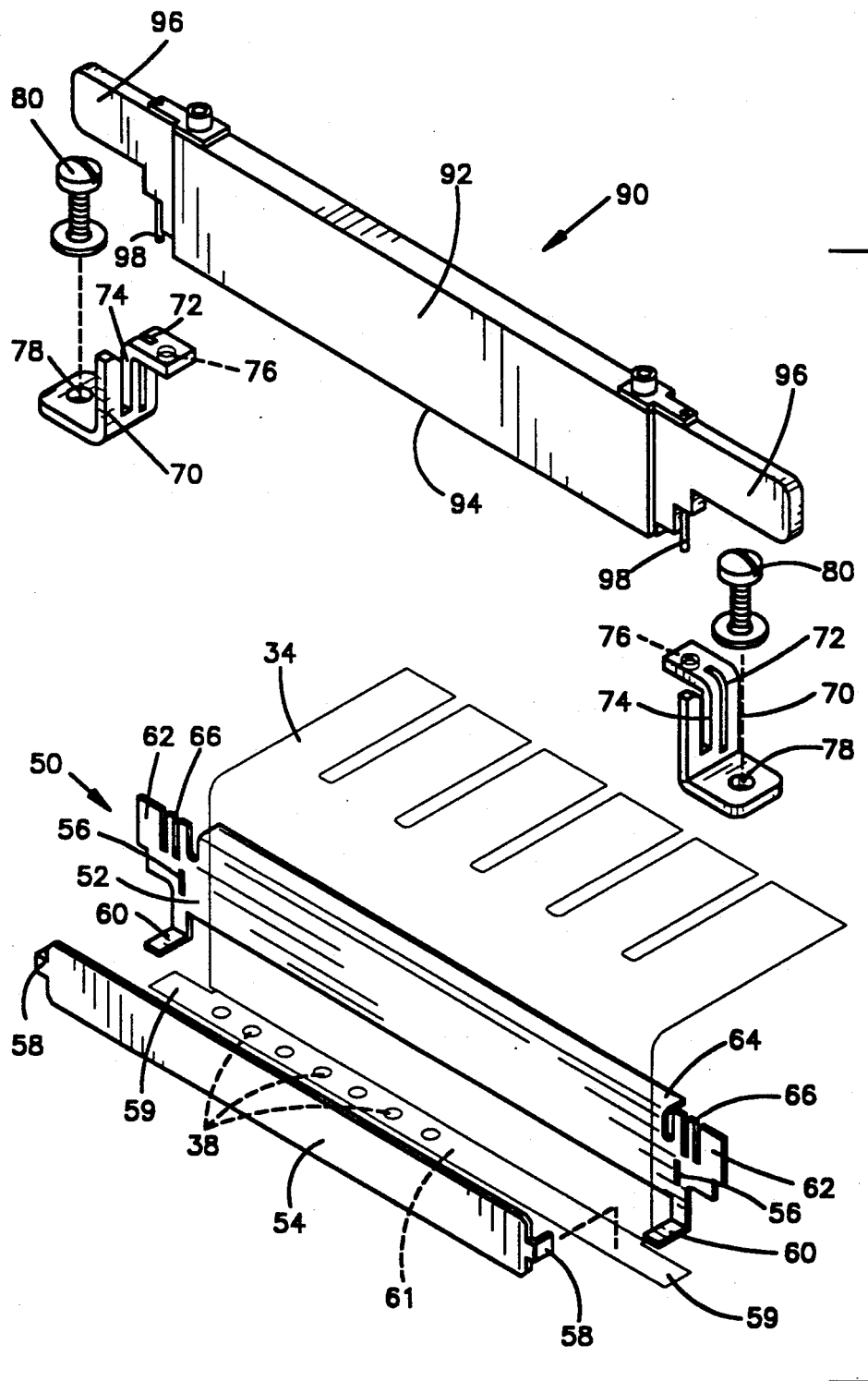
FIG. 3 is an exploded perspective view of the strain relief clamping device of the present invention.

As can best be seen in FIG. 3, the strain relief clamping structure 50 includes a support element 52 and a pressure exerting element 54 and between which elements 52 and 54 the flexible circuit is clamped. Both elements are preferably formed of thin sheet metal, and the pressure element 54 is preferably bowed and spring tempered such that when it is pressed into with the support element 52 with the flexible circuit 34 clamped therebetween (as will be described presently), it will provide a pressure across the entire surface of the flexible circuit.

To effect such a connection, the support element 52 is provided with a pair of notches 56 and the pressure element 54 is provided with a pair of tabs 58 which align with and insert in the notches 56. To secure the flexible circuit 34 to the strain relief clamping structure the flexible circuit 34 is first placed between the support element 52 and the pressure element 54; the tabs 58 of the pressure element 54 are inserted through the notches 56 of the support element 52 and then bent. Due to the bowed configuration of the pressure element 54, insertion of the tabs 58 through the notches 56 and bending tabs 58 will flatten the pressure element 54 thereby applying pressure along the entire length of the flexible circuit 34 firmly clamping it between the elements 52 and 54.

The end of the flexible circuit 34 is provided with a pair of laterally extending ears 59 and when the flexible circuit 34 is turned as shown in FIG. 3, the ears 59 will abut against the bottom of locating feet 60 formed on the support element 52. This configuration will provide a face or surface 61 of the flexible circuit 34 which is essentially perpendicular to the plane in which the flexible circuit 34 lies between the support element 52 and pressure element 54. It is this surface or face, which is between the ears 59, that contains the contacts 38 that will be secured to the pads 48 on the circuit board. The support element 52 is also provided with a pair of mounting tongues 62, the purpose of which will be described presently, an apron 64 which allows the flexible circuit to be folded over and extend at an angle normal to the plane in which the flexible circuit is carried between the elements 52 and 54, and a pair of spring support projections 66 the purpose of which will also be described presently.

Figure 7:
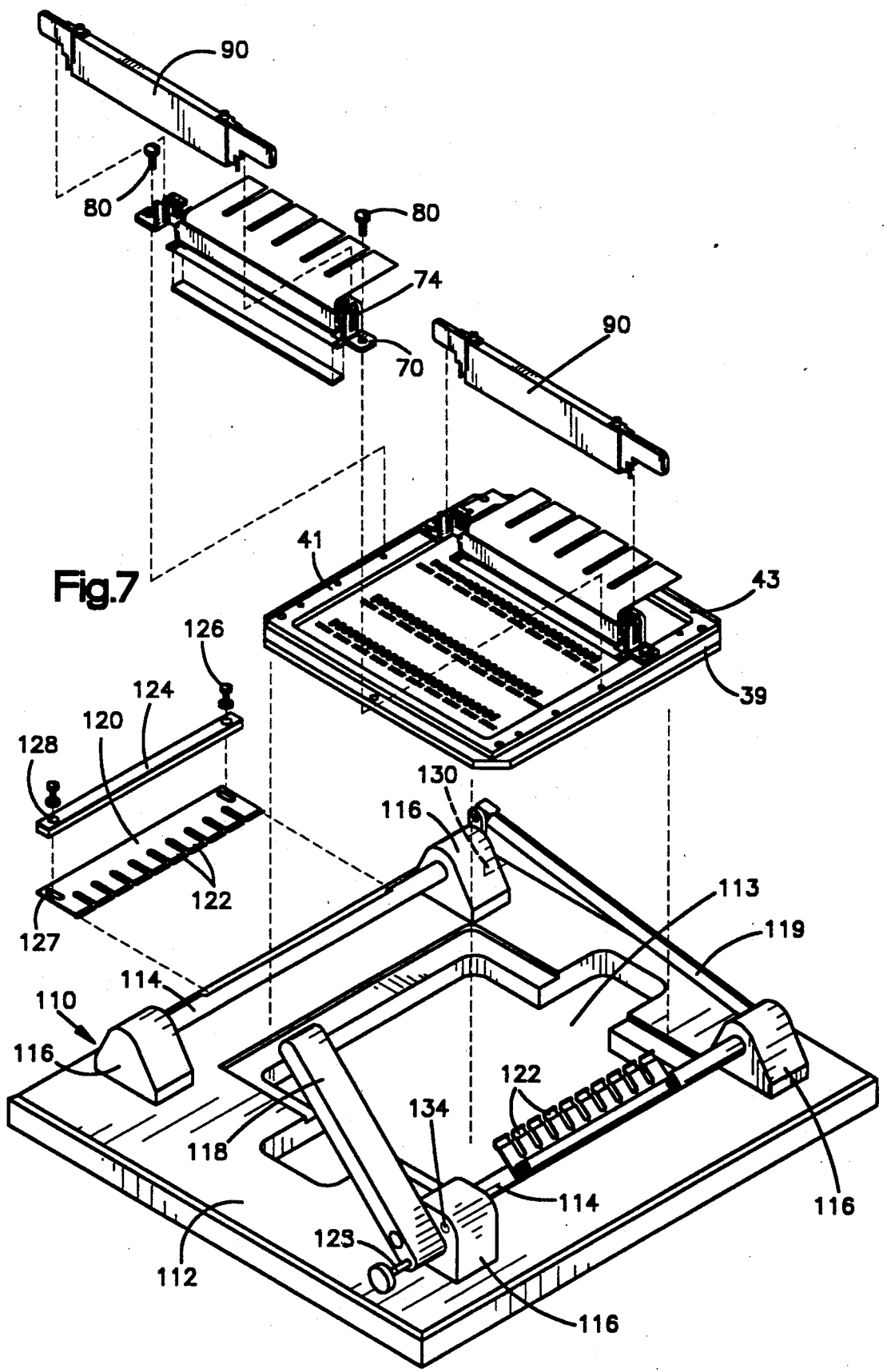
FIG. 7 is an exploded perspective view showing the various elements of the mounting device and substrate.

The strain relief clamping structure 50 further includes a pair of mounting brackets 70 each of which has a closed slot 72 and an open slot 74. The mounting brackets 70 each have a bottomed spring receiving bore 76. The mounting brackets 70 further include enlarged apertures 78 through which bolts 80 pass to secure the mounting brackets 70 to the frame members 41 and 42 (FIG. 7) of the circuit board structure 39. The support element 52 with the flexible circuit 34 secured therein, is mounted to the mounting brackets 70. The enlarged apertures 78 (i.e. a diameter larger than the diameter of the bolts 80) allow for adjustment of the brackets in the plane of the circuit board 40 to thereby provide for the accurate alignment of the contacts 38 with the pads 48.

Figure 4:
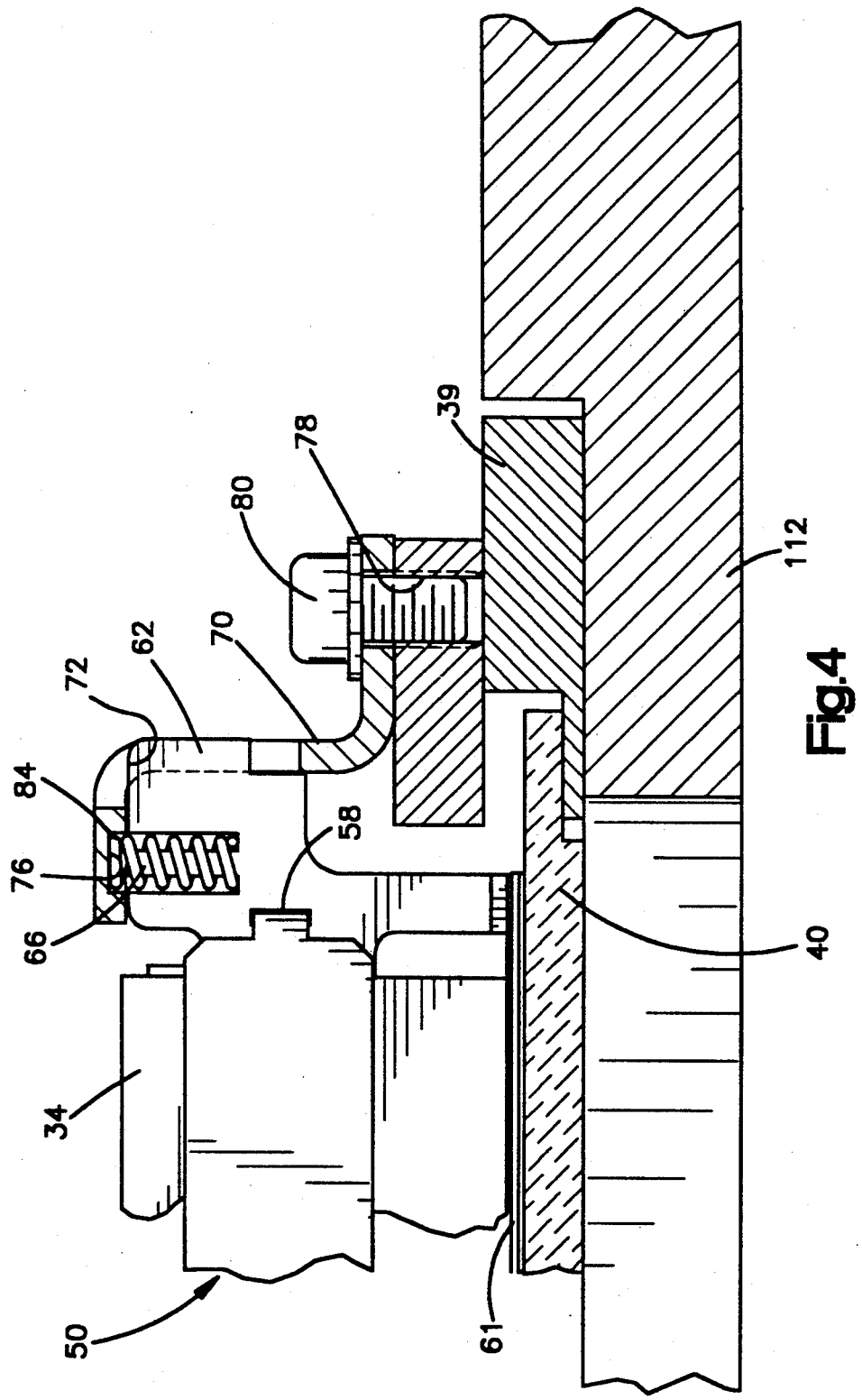
FIG. 4 is a partial longitudinal sectional view of the mounting of the flexible circuit utilizing the strain relief clamping device of this invention.
Figure 6A:
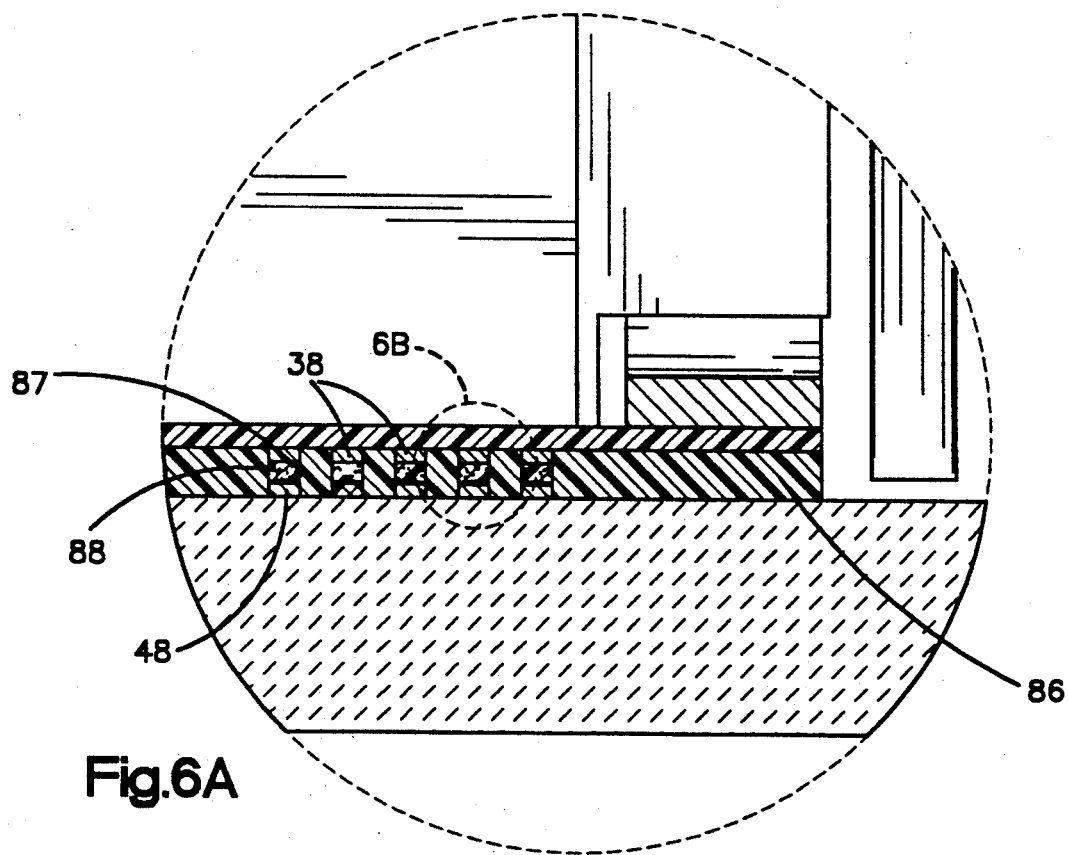
FIGS. 6A and 6B are detailed sectional views of the interconnection of contacts on the flexible circuit with pads on the substrate utilizing an interposer.
Figure 6B:
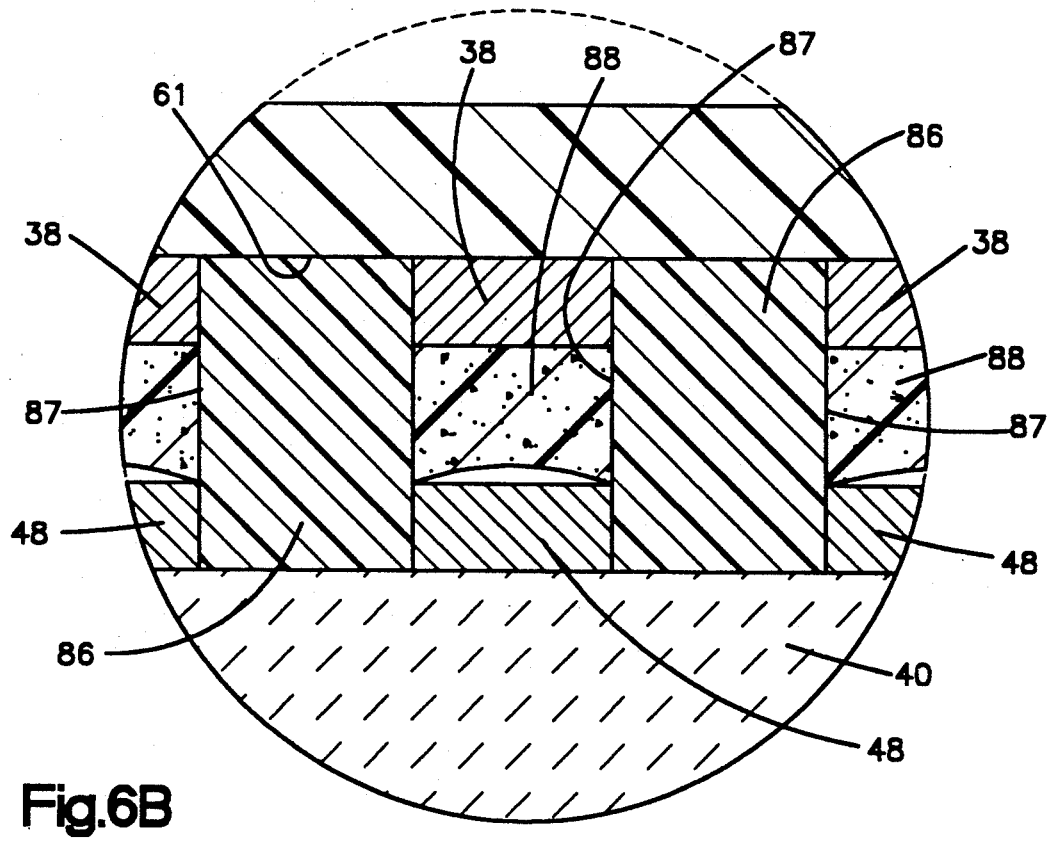

The support element 50 is also mounted in such a fashion to allow for differences in dimensions that can occur in manufacturing because of accumulated variations within specified tolerances. To this end, and as can best be seen in FIG. 4, the mounting tongues 62 are inserted and mounted in the closed slots 72 of the mounting brackets 70 with a coil springs 84 carried on each projection 66 and extending into bottomed bores 76 of the mounting brackets 70. This compliant or resilient mounting will be essentially a self adjusting device to allow the bottom surface 61 of the flexible circuit 34 between the ears 59 to be biased into contact (either directly or through an interposer) with the surface of the board 40. Further, during the assembly operation, the contact between the contacts 38 on the flexible circuit 34 and the pads 48 on the circuit board 40 can be made. Although the contacts 38 on the flexible circuit 34 can be brought directly into contact with the pads 48 on the circuit board 40, in the preferred embodiment this is done by means of conductive paste which is disposed in an interposer 86. As can be seen in FIGS. 6A and 6B, the interposer 86 which is a thin film of thermo plastic-material such as a siloxane-polyimide copolymer, is secured to the circuit board 40. The interposer is provided with a series of through apertures 87 which correspond in location to the pads 48 on the circuit board 40, and the interposer is positioned on the circuit board 40 with the apertures 87 aligned with the pads 48. Conductive paste 88 is disposed in each opening 87. This conductive paste can be a siloxane polyimide copolymer filled with microscopic gold particles. The contacts 38 on the flexible circuit are aligned with the apertures 87 to allow for a bonding of both the contacts 38 and pads 48 to the paste 88 in the apertures. Conventionally, in order to form a good bond of the paste to both the contacts 38 and the pads 48, the structure is heated to allow proper flow of the siloxane polyimide material. Typical temperatures are in the range of 180°–230° C.

To assist in forming a good connection during the bonding process, it is advantageous to maintain a substantially uniform pressure to assure proper flow of the paste 88. Also the pressure should be such as to prevent over-squeezing of the forming paste joints. To this end, an assembly tool is provided to assist in obtaining the proper bond. This tool includes a pressure bar element 90 which has a central portion 92 with a circuit contacting surface 94 and mounting slides 96, which slides slidably mount in the slots 74 of the mounting brackets 70 (see FIGS. 3 and 4). The pressure bar has a pair of gauge pins 98.

Figure 8:
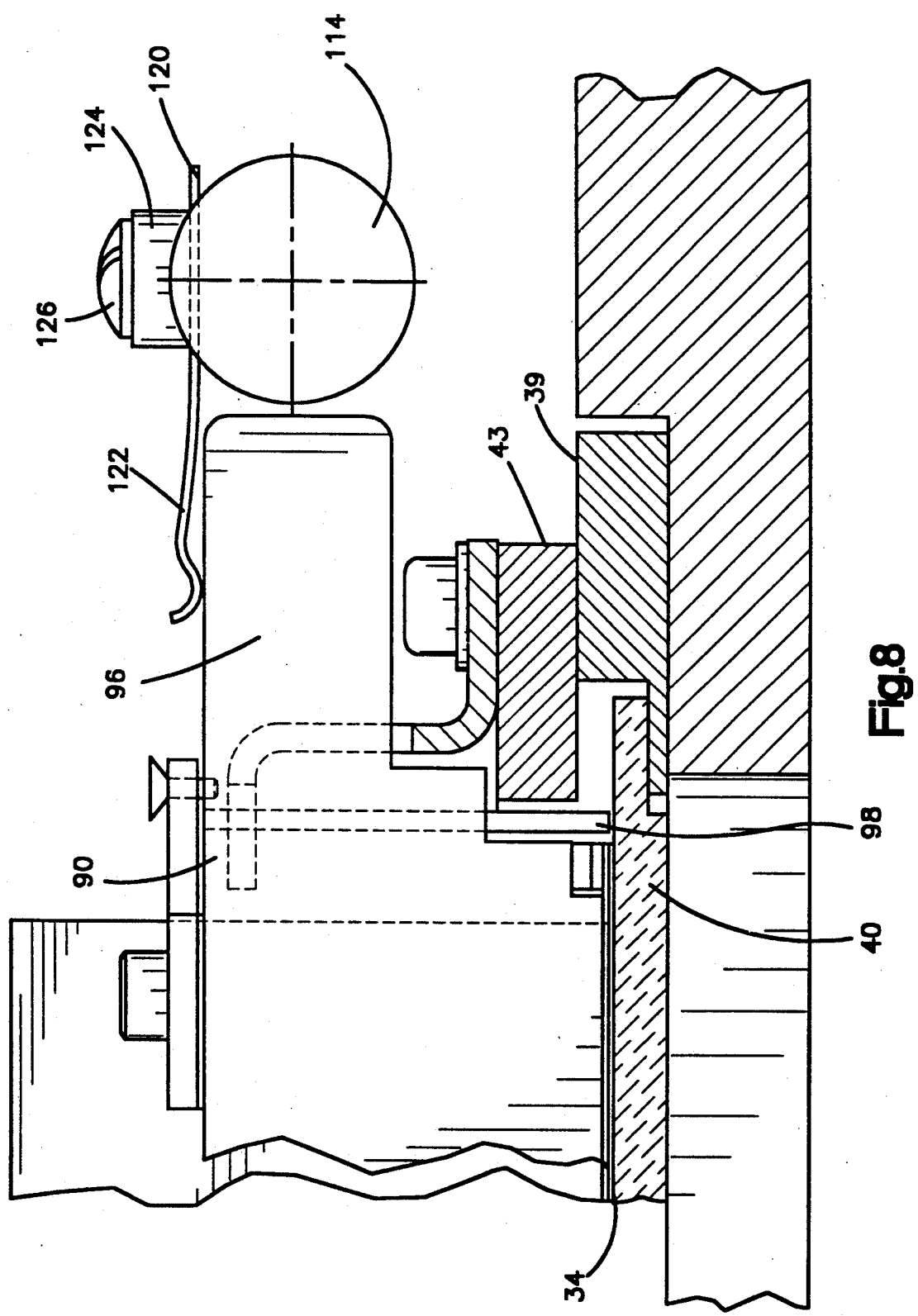
FIG. 8 is a detailed sectional view of a portion of the mounting device showing one of the resilient fingers biasing against a clamping element to maintain the clamping element in contact with the substrate.

The pressure bar element is urged toward and into contact with the flexible circuit 34 between the ears 59 by means of pressure exerting mechanism 110 (see FIGS. 7 and 8) to maintain the proper pressure during bonding. The pressure exerting mechanism includes a frame 112 with a central opening 113 and having a pair of axles 114, each axle being mounted for rotation by a pair of bearings 116 at opposite ends thereof. One axle 114 has a lever 118 which serves to manually rotate the axle. A linkage 119 connects the two axles 114 to allow both to rotate together but in opposite directions when the lever 118 is actuated. Further, each axle has secured thereto a resilient element 120, each resilient element having a plurality of resilient fingers 122. The resilient elements 120 are secured to the axles 114 by means of mounting bars 124 and screws 126 which pass through elongated slots 127 in the resilient element 120 and hole 128 in bar 124. By adjusting the position of the resilient element 120 on the axle 114, the amount of extension of the fingers from the axle can be controlled thereby controlling the amount of pressure that will be exerted by the various fingers 122.

To apply pressure, the pressure bars 90 are positioned in the slot 74 of the brackets 70, the assembly 41 with the circuit board 40 is placed in the pressure exerting mechanism 110 located within the confines of the spacing 113. The axles 114 are rotated using lever 118. The rotation of the axle will bring the resilient fingers 122 into contact with slides 96 on the pressure bars 90. Rotation places pressure on the pressure bars 90 and is continued until pin 129 aligns with opening 134 formed in the bearing, at which point the pin 129 is pushed into the opening 124. This will maintain the pressure fingers in contact with the pressure bar element 90 urging the bar element into intimate contact with the flexible circuit 34 which in turn is urged into contact with the interposer and circuit board 40. This gives the proper pressure on the bond paste joint such that when heated, proper flow off the paste 88 will occur. Pins 98 serve as stops so that after a proscribed flow occurs, the pressure is transmitted to pins 98 so flow will stop (i.e. no pressure = no flow). This prevents over compression of the joints. After the connection of the pads 48 to contacts 38 is made, the tool is removed and the structure with the flexible electrical cable received thereto is ready for mounting as shown in FIGS. 1 and 2.

Since the substrate circuit board 40 is formed of ceramic material having a low coefficient of thermal expansion, and the other elements are principally formed of metal with higher coefficients of thermal expansion, during this heating the cured paste will expand and there will be a differential amount of expansion between the metal members 52 and 54 on the one hand, and the ceramic substrate 40 on the other. However, the mounting of the members 52 and 54 on the brackets 70 by means of the springs 84 allows for thermal expansion to take place against the bias of the springs 84 without causing a cracking of the substrate or without causing undue deformation of the interposer and thereby forming poor connections or shorts between contacts. The same spring mounting will also allow contact to be maintained during later use in a cryogenic environment by assuring that the flexible circuit 34 is urged against the face of the circuit board 40, again by virtue of the coil springs 84.

Thus, the mounting of the support element 52 in the mounting bracket 70 utilizing the coil springs 84 provides for compliant resilient support in a direction normal to the surface of the circuit board. However, the slots 72 of the brackets 70 secure the ears 62 of the support element 52 so that it does not move in the plane of the circuit board.

Thus, according to the present invention, a strain relief clamping structure is provided which will mount a flexible circuit to a circuit board, which can be adjusted in the plane of the circuit board to provide precise alignment of the contacts and which is yieldingly responsive to the thermal expansion/contraction of the various elements. This allows the connection to be maintained properly and not hampered or broken due to thermal expansion or contraction both during the heating necessary to form the connection and during any subsequent cooling which may occur during the operation of the device.

While one embodiment of this invention has been shown and described, various adaptions and modifications can be made without departing from the scope of the invention as defined in the appended claims.

We claim:

1. A mounting structure for mounting a flexible electrical circuit to a rigid substrate to effect electrical connection between contacts on one side of the flexible electrical circuit with electrical pads on one side of the substrate comprising:
    a clamping member disposed to clamp said flexible electrical circuit and position said flexible electrical circuit with said one side thereof in face to face relationship with said one surface of said substrate;
    a supporting structure carried by said substrate and mounting said clamping member to maintain said flexible electrical outlet and said substrate in face to face relationship;
    said mounting structure including a mechanism yieldingly responsive to thermal expansion normally urging said flexible electrical circuit toward engagement with said substrate.

2. The structure as defined in claim 1 further characterized by an interposer disposed between said flexible circuit and said substrate, said interposer having conductive paths therein interconnecting said electrical contacts with said pads.

3. The structure as defined in claim 1 further characterized by the contacts on said flexible circuit being in contact with the pads on the substrate.

4. The structure as defined in claim 1 wherein said support structure includes a bracket mounting said clamping member.

5. The structure as defined in claim 4 wherein said bracket and said clamping member include a tongue in groove structure mounting said clamping member on said bracket member.

6. The structure as defined in claim 5 wherein one of said clamping member and said bracket has a projection and wherein said spring biasing spring is a coil spring surrounding said projection.

7. The structure as defined in claim 4 wherein said mechanism includes a resilient connection between said bracket and said clamping member.

8. The structure as defined in claim 7 wherein said resilient connection includes biasing springs.

9. The structure as defined in claim 8 wherein said mechanism includes a biasing spring interposed between said bracket and said clamping member.

10. A method of mounting a flexible electrical circuit to a rigid substrate to effect electrical connection between contacts on one side of the flexible electrical circuit with electrical pads on one side of the substrate comprising the steps of:
    providing a clamping member, and clamping said flexible electrical circuit in a position with said one side of said flexible electrical circuit in face to face relationship with said one surface of said substrate;
    providing a supporting structure carried by said substrate, mounting said clamping member on said supporting structure to maintain said flexible electrical circuit and said substrate in face to face relationship;
    providing a mechanism in said mounting structure which is yieldingly responsive to thermal expansion and which normally urges said flexible electrical circuit toward engagement with said substrate.

11. The method as defined in claim 10 further characterizing said mounting structure includes an element, and slidably mounting said element in said supporting structure to normally urge the contacts toward engagement with the pads.

12. The method as defined in claim 10 further characterized by the steps of providing an interposer between said flexible electrical circuit and said substrate, and wherein electrical contact is made between the contacts on the flexible electrical circuit and the pads through conductive material in said interposer.

13. The method as defined in claim 10 wherein the electrical contacts on the flexible electrical circuit are biased directly into contact with the pads on the substrate.

* * * * *